(12) United States Patent
Chang

(10) Patent No.: US 6,589,835 B2
(45) Date of Patent: Jul. 8, 2003

(54) METHOD OF MANUFACTURING FLASH MEMORY

(75) Inventor: Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/814,408

(22) Filed: Mar. 22, 2001

(65) Prior Publication Data

US 2002/0137289 A1 Sep. 26, 2002

(51) Int. Cl.[7] .......................................... H01L 21/8238
(52) U.S. Cl. ........................ 438/220; 438/254; 438/256; 438/263; 438/269; 438/787
(58) Field of Search ................................ 438/220, 254, 438/256, 263, 264, 787, 788, 773, 618, 622, 269

(56) References Cited

U.S. PATENT DOCUMENTS

| | | | | |
|---|---|---|---|---|
| 5,739,564 A | * | 4/1998 | Kosa et al. ................. | 257/298 |
| 5,827,370 A | * | 10/1998 | Gu .............................. | 118/715 |
| 5,843,822 A | * | 12/1998 | Hsia et al. .................. | 438/254 |
| 5,861,347 A | * | 1/1999 | Maiti et al. ................. | 438/787 |
| 6,013,551 A | * | 1/2000 | Chen et al. ................. | 438/264 |
| 6,066,555 A | * | 5/2000 | Nulty et al. ................. | 438/634 |
| 6,171,899 B1 | * | 1/2001 | Liou et al. .................. | 438/240 |
| 6,228,713 B1 | * | 5/2001 | Pradeep et al. ............ | 438/257 |
| 6,291,331 B1 | * | 9/2001 | Wang et al. ................ | 438/618 |
| 6,426,285 B1 | * | 7/2002 | Chen et al. ................. | 438/624 |
| 2001/0018275 A1 | * | 8/2001 | Vulpio ......................... | 438/789 |

OTHER PUBLICATIONS

Ohring, Milton. Materials Science of Thin Films, 2nd ed., Academic Press, 2002, pp. 313–317, 327–329.*

* cited by examiner

*Primary Examiner*—Michael S. Lebentritt
*Assistant Examiner*—Michael K. Luhrs

(57) ABSTRACT

A process of manufacturing a flash memory device having a tunnel oxide layer with high reliability, low defect and interface trap by using semi-atmospheric pressure chemical vapor deposition (SPACVD) and tetra-ethyl-ortho-silicate (TEOS) reactant. SAPCVD is performed accompanied with a reaction temperature between about 600° C. and about 750° C. and a reaction pressure between about 340 Torr and about 500 Torr to react TEOS and oxygen.

20 Claims, 1 Drawing Sheet

METHOD OF MANUFACTURING FLASH MEMORY

FIELD OF THE INVENTION

The present invention relates to a method of manufacturing interpoly dielectric layer to improve reliability of flash memory devices. More particularly, it is related to a method of manufacturing flash memory devices by semi-atmospheric pressure chemical vapor deposition (SAPCVD) and tetra-ethyl-ortho-silicate (TEOS) reactants.

BACKGROUND OF THE INVENTION

Flash memory is a semi-conductor technique developed according to RAM product of computer. Flash memory is a solid-state storage system, which consumes less-power to change inner data quickly by using the efficient block way, and flash memory retains data without any additional power.

Flash memory and other solid-state memories, for example, read only memory (ROM), static/dynamic random access memory (SRAM/DRAM), and electrically erasable programmable read only memory (EEPROM) are applied widely.

Among these solid-state memories, the flash memory is the best storage system with high quality since the flash memory has characteristics of non-volatile, rewritable, high density and stability.

FIG. 1 is a cross-section view of a conventional flash memory device. The structure of the conventional flash memory device includes a substrate 10, and a source region 12, a drain regain 14, and a channel region 16 located in the substrate 10, and a stacked gate structure 18 located on the substrate 10. Herein the stacked gate structure 18 further includes a tunnel oxide layer 20, a floating gate 22, an interpoly dielectric layer 24, and a control gate 26. The floating gate 22 and the control gate 24 are usually composed of polysilicon, and the interpoly dielectric layer 24 is composed of multi-insulated layers, i.e. oxide/nitride/oxide (ONO) structure. The ONO structure 24 includes a bottom oxide layer 28, a nitride layer 30, and a top oxide layer 32. When current flows through the channel region 16 of the flash memory device to electrically connect the source region 12 and the drain region 14, meanwhile electric field is applied to the stacked gate structure 18.

To be the insulation structure between the floating gate 22 and the control gate 24, the ONO structure 24 has to be high reliability. For example, if the top oxide layer 32 is too thick, the needful conductive voltage may be increased. Otherwise, if the top oxide layer 32 is too thin, in the flash memory the current leaks out easily so that the memory ability and storage time of charges also decreased. Accordingly, it is important to control the thickness of the top oxide layer. In addition, if the nitride layer is too thin, current leakage may be happened between floating gate 22 and control gate 24, and charge storage time is also shortened.

The conventional method of manufacturing the interpoly dielectric layer 24 ONO structure of flash memory device is to oxidize the nitride layer directly by wet thermal oxidation. For example, under 950° C. vapor circumstance the process of oxidizing the nitride layer about 40 minutes to transform a portion of the nitride layer into the top oxide layer 32.

The other conventional method of manufacturing the interpoly dielectric layer 24, ONO structure of flash memory device is to form an oxide layer on the nitride layer, for example, by low-pressure vapor deposition (LPCVD). The LPCVD process is performed under the circumstance, includes: lower temperature between about 600° C. and about 850° C. and higher pressure between about 400 mTorr and about 750 mTorr; injecting reactive gases (as $SiH_4$ and $N_2O$) and inert gas or $N_2$ to form $SiO_2$ layer; and performing a rapid thermal anneal (RTA) process to nitrify the oxide layer for about 40 seconds to 80 seconds under a temperature between about 700° C. and 950° C. in order to density the oxide layer or reduce defects and charge trap formed on the top oxide layer of flash memory devices. Since the increased temperature decomposes $N_2O$ to $N_2$ and reactive oxygen molecules, the oxygen molecules will diffuse to oxygen lattice's vacancies of LPCVD oxide layer resulting to density decreasing and current leakage.

SUMMARY OF THE INVENTION

In the above interpretation, the conventional method of wet thermal oxidation tends to react excess nitride, so that the nitride layer may be too thin resulting charge leakage. In the other hand, long reactive time and high reaction temperature also introduce defects and charge traps and decrease the reliability of tunnel oxide layer.

In the above interpretation, the conventional method of LPCVD process is more complex and consumes more gases by repeating decompression and gas exhausting to maintain low-pressure circumstance. Molecules in low-pressure move in the form of molecular flow, so that the collision frequency between molecules is very low and it is therefore very hard to produce the collisions needed to induce CVD process. Hence, the deposition rate of film is slow and takes long time. Moreover the turbulent flow also induces dust in reaction chamber so that the deposition quality is influenced. Furthermore, the $SiH_4$ reactant is reacted by homogeneous nucleation so that the step coverage ability of this conventional process is poor because of the surface pollution of the reactor by dust.

Therefore, one aspect of the present invention is to provide a semi-atmospheric pressure chemical vapor deposition to improve the disadvantages of long thermal budget and uncontrolled thickness, which are caused from conventional wet thermal oxidation under high temperature. The present invention also improves the problems caused by repeating decompression, low collision frequency and turbulent flow.

Other aspect of the present invention is that using tetra-ethyl-ortho-silicate (TEOS) reactants to form the oxide layer to improve the disadvantage of dusted pollution caused from $SiH_4$.

According to the above aspects, the present invention combines SAPCVD process and TEOS reactants to decrease defect and interface trap. Wherein SAPCVD includes the step of reacting TEOS reactants with oxygen under temperature between about 600° C. and 750° C. and pressure between about 340 Torr and 550 Torr.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method of manufacturing interpoly dielectric layer to improve reliability of flash memory devices by introducing a top oxide layer with a few defects and interface traps. The present invention produces the oxide/nitride/oxide (ONO) structure of flash memory devices by using semi-atmospheric CVD (SAPCVD) and tetra-ethyl-ortho-silicate (TEOS) reactants to decrease defect and interface trap and to increase reliability of the tunnel oxide layer.

Figure 1:
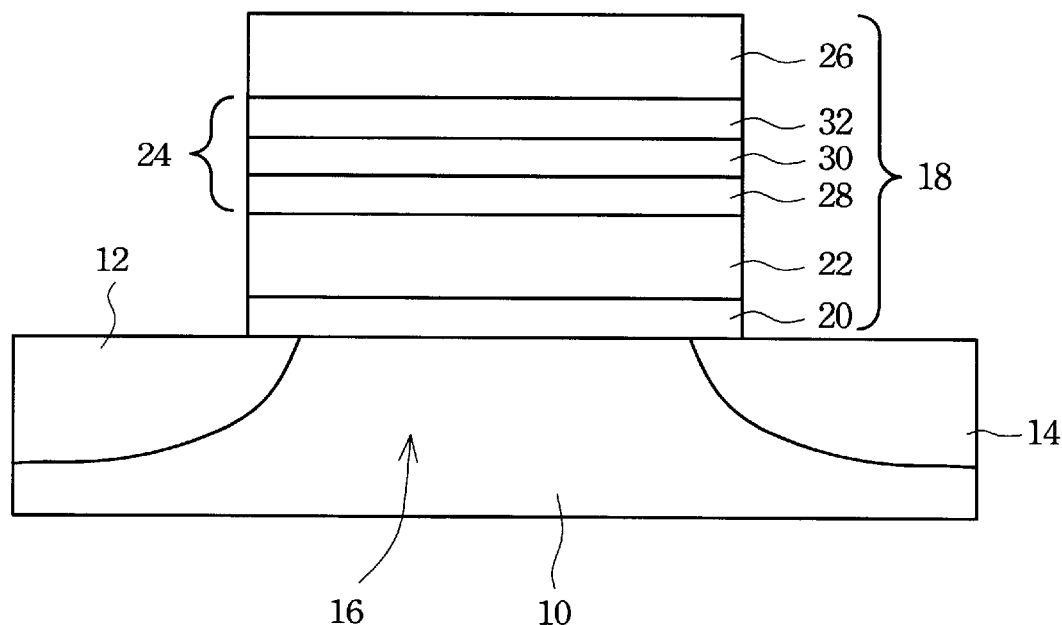
FIG. 1 is a cross-section view of a conventional flash memory device.
Figure 2:
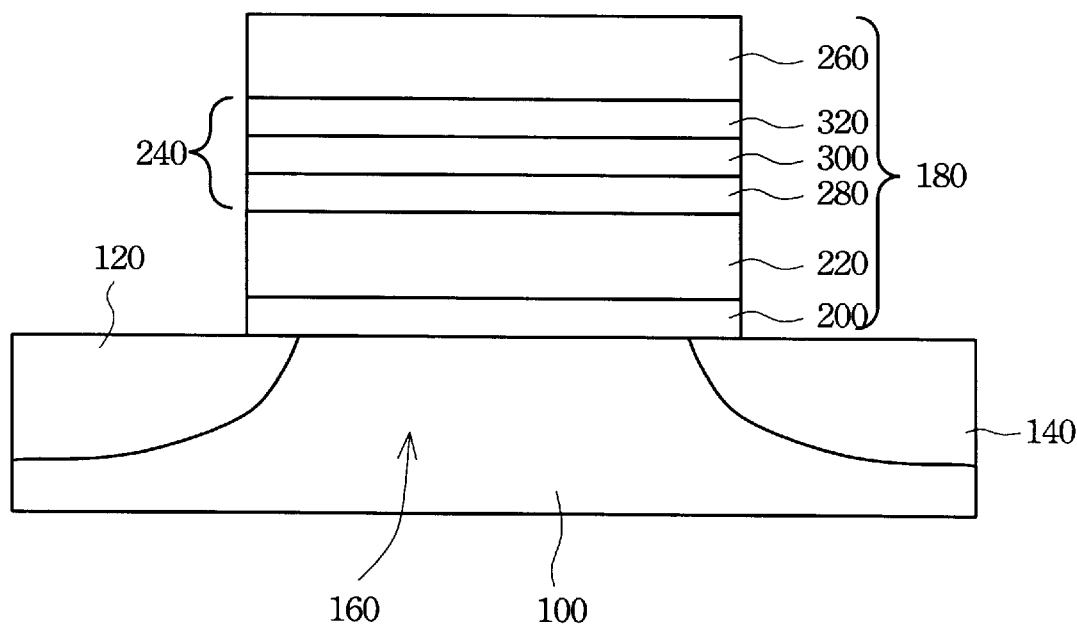
FIG. 2 is a cross-section view of a flash memory device according to the present invention.

FIG. 2 is a cross-section view of a flash memory device according to the present invention. The flash memory device of the present invention includes a substrate 100 and a source region 120, a drain regain 140 and a channel region 160 located in the substrate 100, and a stacked gate structure 180 located on the substrate 100. The stacked gate structure 180 further includes a tunnel oxide layer 200, a floating gate 220, an interpoly dielectric layer 240, and a control gate 260. For example, the floating gate 220 and the control gate 240 are, composed of polysilicon, and the interpoly dielectric layer 240 is composed of multi-insulated layers, oxide/nitride/oxide (ONO) structure. The ONO structure 240 is a stacked structure composed of a bottom oxide layer 280, a nitride layer 300, and a top oxide layer 320.

One characteristic of the present invention is the use of SAPCVD method to form the top oxide layer 320.

The reaction temperature of SAPCVD method of the present invention is, for example, between about 600° C. and about 750° C., and the preferred reaction temperature is about 680° C. The reaction pressure is, for example, between about 340 Torr and about 550 Torr, and the preferred pressure is about 400 Torr. Under such process circumstance, reactive gases, for example, TEOS and oxygen, are introduced, and following reaction (1) is also performed to form the top oxide layer 320, wherein the deposition thickness of the top oxide layer 320 is between about 20 Å and about 80 Å, and the preferred deposition thickness is about 40 Å.

$$Si(OC_2H_5)_4 \rightarrow SiO_2 + \text{by-product} \quad (1)$$

(Wherein the by-product is a complex mixture of organic and organosilicon compounds)

According to the above process, the reaction temperature of the present invention is lower than the reaction temperature (950° C.) of the conventional method to avoid decomposition of interpoly dielectric layer under high temperature. Another advantage of the present invention is that before reaction, the pressure of the chamber is decompressed to 500 mTorr instead of 5 mTorr disclosed by conventional LPCVD method. Moreover, gases are transported into the chamber in a continuous way to achieve vapor deposition and the waste gases are exhausted through exhausting system. Therefore, it is not necessary to vacuum the chamber to perform the next stage of the process, and the time and gas consumption problems are also dissolved.

Furthermore, the pressure of the present invention is semi-atmospheric pressure. The collision frequency of molecule is enhanced and the reaction time is shortened compared with the low-pressure circumstance of LPCVD. Moreover, in the present invention, the way of delivering the gas continuity is used to lower the turbulent flow do the phenomenon of reactant to be particle decreases. Therefore there are the preferred uniformity and quality in the top oxide layer of the deposition and lowering the thermal budget.

According to the above advantages, the present invention can improve the thermal budget and decrease charge trap to get the tunnel oxide layer with high reliability. The present invention is easier than the conventional step of oxidization to control the thickness of interpoly dielectric layer to avoid the defect caused by the too thin or too thick thickness of oxide layer in the interpoly dielectric layer and the current leakage problem caused by the defect is avoided also. Otherwise, the present invention can shorten reaction time and resolve dust problem so that an interpoly dielectric layer with high deposition quality is formed.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of manufacturing a flash memory, which can improve the reliability of the flash memory, the method comprising:

forming a tunnel oxide layer on a substrate;

forming a floating gate on the tunnel oxide layer;

forming an interpoly dielectric layer on the floating gate, wherein the interpoly dielectric layer comprises a first oxide layer, a nitride layer and a second oxide layer, and the second oxide layer is formed by using a semi-atmospheric pressure chemical vapor deposition (SAPCVD), and a thickness of the second oxide layer is between about 20 Å and about 80 Å; and forming a control gate on the interpoly dielectric layer.

2. The method according to claim 1, wherein the first oxide layer, the nitride layer and the second oxide layer in a stacked structure from bottom to top are located on the floating gate.

3. The method according to claim 1, wherein a reaction temperature of the semi-atmospheric pressure chemical vapor deposition is between about 600° C. and 750° C.

4. The method according to claim 1, wherein a reaction temperature of the semi-atmospheric pressure chemical vapor deposition is about 680° C.

5. The method according to claim 1, wherein a reaction pressure of the semi-atmospheric pressure chemical vapor deposition is between about 340 Torr and about 550 Torr.

6. The method according claim 1, wherein a reaction pressure of the semi-atmospheric pressure chemical vapor deposition is about 400 Torr.

7. The method according to claim 1, wherein the semi-atmospheric pressure chemical vapor deposition further comprises the use of tetra-ethyl-ortho-silicate (TEOS) and oxygen.

8. The method according to claim 1, wherein a thickness of the second oxide layer is about 40 Å.

9. A method of manufacturing a flash memory, which can improve the reliability of the flash memory, the method comprising:

forming a tunnel oxide layer on a substrate;

forming a floating gate on the tunnel oxide layer;

forming an interpoly dielectric layer on the floating gate, wherein the interpoly dielectric layer comprises a first oxide layer, a nitride layer and a second oxide layer, and the second oxide layer is formed by using a semi-atmospheric pressure chemical vapor deposition (SAPCVD) comprising the use of tetra-ethyl-orthosilicate (TEOS) and oxygen, and the first oxide layer, the nitride layer and the second oxide layer in a stacked structure from bottom to top are located on the floating gate, and a thickness of the second oxide layer is between about 20 Å and about 80 Å; and forming a control gate on the interpoly dielectric layer.

10. The method according to claim 9, Wherein a reaction temperature of the semi-atmospheric pressure chemical vapor deposition is between about 600° C. and 750° C.

11. The method according to claim 9, wherein a reaction temperature of the semi-atmospheric pressure chemical vapor deposition is about 680° C.

12. The method according to claim 9, wherein a reaction pressure of the semi-atmospheric pressure chemical vapor deposition is between about 340 Torr and about 550 Torr.

13. The method according to claim 9, wherein a reaction pressure of the semi-atmospheric pressure chemical vapor deposition is about 400 Torr.

14. A method of manufacturing a flash memory, which can improve the reliability of the flash memory, the method comprising:

forming a tunnel oxide layer on a substrate;

forming a floating gate on the tunnel oxide layer;

forming an interpoly dielectric layer on the floating gate, wherein the interpoly dielectric layer comprises a first oxide layer, a nitride layer and a second oxide layer, and the second oxide layer is formed by using a semi-atmospheric pressure chemical vapor deposition (SAPCVD), and a thickness of the second oxide layer is about 40Å; and forming a control gate on the interpoly dielectric layer.

15. The method according claim 14, wherein the first oxide layer, the nitride layer and the second oxide layer in a stacked structure from bottom to top are located on the floating gate.

16. The method according to claim 14, wherein a reaction temperature of the semi-atmospheric pressure chemical vapor deposition is between about 600° C. and 750° C.

17. The method according to claim 14, wherein a reaction temperature of the semi-atmospheric pressure chemical vapor deposition is about 680° C.

18. The method according to claim 14, wherein a reaction pressure of the semi-atmospheric pressure chemical vapor deposition is between about 340 Torr and about 550 Torr.

19. The method according to claim 14, wherein a reaction pressure of the semi-atmospheric pressure chemical vapor deposition is about 400 Torr.

20. The method according to claim 14, wherein the semi-atmospheric pressure chemical vapor deposition further comprises the use of tetra-ethyl-ortho-silicate (TEOS) and oxygen.

* * * * *